United States Patent
Gorti et al.

(10) Patent No.: US 9,291,676 B2
(45) Date of Patent: Mar. 22, 2016

(54) SCAN WARMUP SCHEME FOR MITIGATING DI/DT DURING SCAN TEST

(71) Applicant: ADVANCED MICRO DEVICES, INC., Sunnyvale, CA (US)

(72) Inventors: Atchyuth K Gorti, Austin, TX (US); Aditya Jagirdar, Austin, TX (US); Bikash Kumar Agarwal, Bangalore (IN); Eric Quinnell, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 342 days.

(21) Appl. No.: 13/773,501

(22) Filed: Feb. 21, 2013

(65) Prior Publication Data

US 2014/0237312 A1    Aug. 21, 2014

(51) Int. Cl.
*G01R 31/28* (2006.01)
*G01R 31/3185* (2006.01)

(52) U.S. Cl.
CPC *G01R 31/318552* (2013.01); *G01R 31/318594* (2013.01)

(58) Field of Classification Search
None
See application file for complete search history.

(56) References Cited

U.S. PATENT DOCUMENTS

| | | | | |
|---|---|---|---|---|
| 2002/0147951 | A1* | 10/2002 | Nadeau-Dostie | G01R 31/318563 714/731 |
| 2008/0195346 | A1* | 8/2008 | Lin | G01R 31/318575 702/119 |
| 2012/0198294 | A1* | 8/2012 | Nadeau-Dostie | G11C 29/50012 714/719 |
| 2012/0221906 | A1* | 8/2012 | Shetty | G01R 31/31855 714/727 |

* cited by examiner

*Primary Examiner* — April Y Blair
*Assistant Examiner* — Thien D Nguyen

(57) ABSTRACT

We report methods relating to scan warmup of integrated circuit devices. One such method may comprise loading a scan test stimulus to and unloading a scan test response from a first set of logic elements of an integrated circuit device at a scan clock first frequency equal to a test clock frequency; adjusting the scan clock from the first frequency to a second frequency by a scan warmup unit, wherein the scan clock second frequency is equal to a system clock frequency; and capturing the scan test response by a shift logic at the scan clock second frequency. We also report processors containing components configured to implement the method, and fabrication of such processors. The methods and their implementation may reduce di/dt events otherwise commonly occurring when testing logic elements of integrated circuit devices.

15 Claims, 6 Drawing Sheets

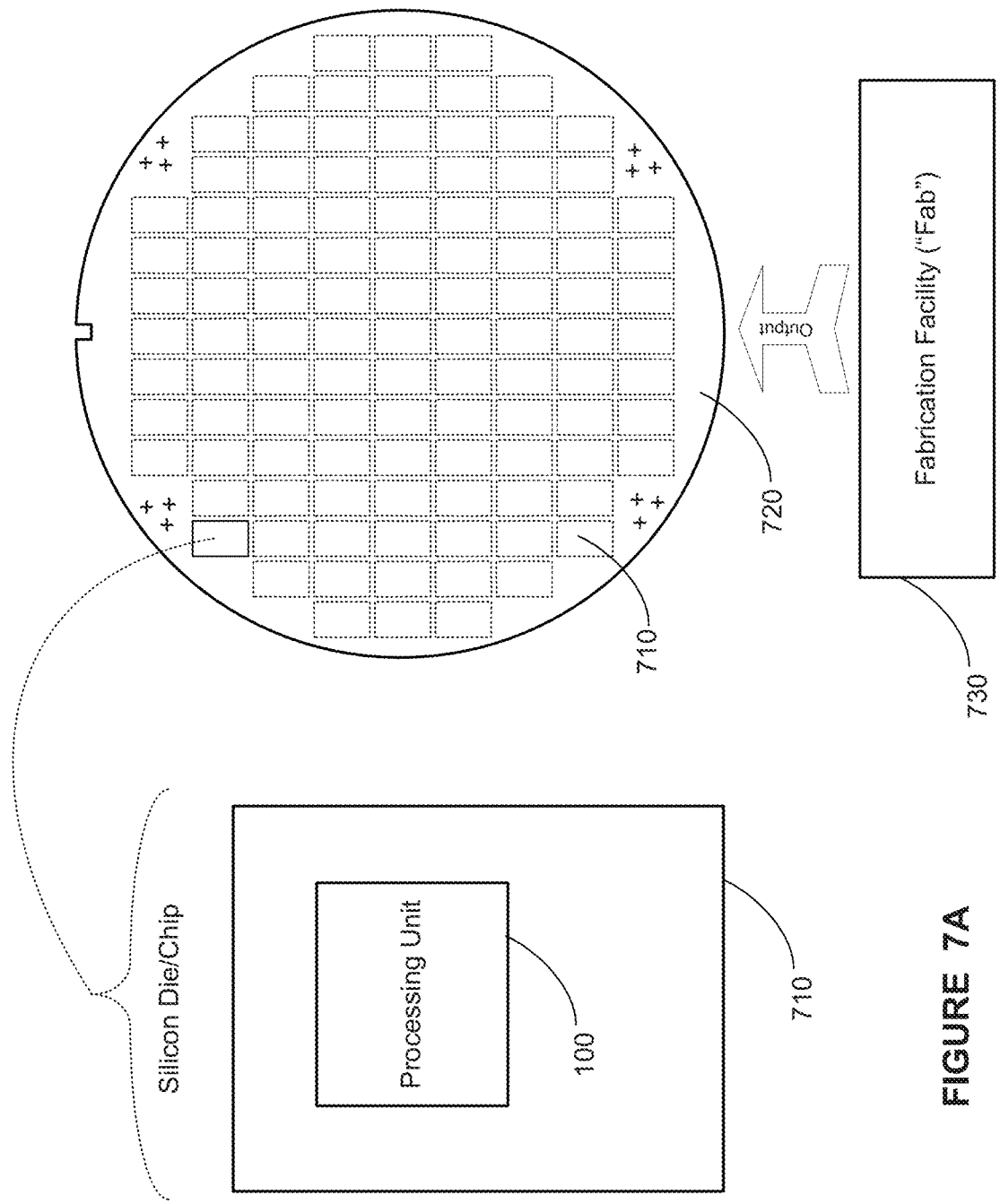

SCAN WARMUP SCHEME FOR MITIGATING DI/DT DURING SCAN TEST

BACKGROUND

1. Technical Field

Generally, the present disclosure relates to integrated circuits, and, more particularly, to improvements in scan and built-in self-testing of integrated circuits.

2. Description of the Related Art

Semiconductor processors comprise many sequential elements, such as various flip flops and combinational logic, which form various complex circuits. During manufacturing and testing of semiconductor processors, various tests are applied. Often, the various circuit portions, such as sequential elements within a processor, must be tested to ensure proper operation of the processor. In many cases, data may be shifted into various sequential elements of the processor and resultant output may be scanned and verified for functional integrity. One of the problems associated with testing of various sequential elements of the processor includes the burden placed on the power supply upon a global shift of data into various sequential elements of the processor. For example, if a global scan signal is applied and de-asserted and an appreciable amount of time takes place between the de-assertion of the global signal and a master clock signal, the chip capacitance may have sufficiently discharged so that when starting up, an instance of power draw may cause an excessive draw of current, a so-called "di/dt" event (an excessive draw of current in a small amount of time). In this case, the excessive current demand may cause a drop in voltage, thereby causing potential operational errors of the various elements in the processor. Even if operational errors are avoided, the drop in voltage may lead to an erroneous underestimation of the maximum voltage and the maximum frequency at which the processor may be operable, thereby making it more difficult in categorizing products based upon performance.

SUMMARY OF EMBODIMENTS

The apparatuses, systems, and methods in accordance with the embodiments disclosed herein may reduce a di/dt event by generating a localized version of a scan shift enable signal, which may be timed more easily than a global scan shift enable signal. Mechanisms controlling and implementing such generating may be formed within a microcircuit by any means, such as by growing or deposition.

Some embodiments provide an apparatus that includes a first set of logic elements; a shift logic configured to load a stimulus to the first set of logic elements at a scan clock first frequency equal to a test clock frequency, unload a scan test response from the first set of logic elements at the scan clock first frequency, and capture a scan test response by a shift logic at a scan clock second frequency; and a scan warmup unit configured to adjust the scan clock from the first frequency to the second frequency, wherein the scan clock second frequency is equal to a system clock frequency. Adjusting the scan clock by the scan warmup unit may mitigate a drop in voltage of a power supply to the integrated circuit associated with a transition of the scan clock from the first frequency to the second frequency, by reducing a change in current draw within a predetermined time period.

Some embodiments provide a method that includes loading a scan test stimulus to a first set of logic elements of an integrated circuit device at a scan clock first frequency equal to a test clock frequency; unloading a scan test response from the first set of logic elements at the scan clock first frequency; adjusting the scan clock from the first frequency to a second frequency by a scan warmup unit, wherein the scan clock second frequency is equal to a system clock frequency; and capturing the scan test response by a shift logic at the scan clock second frequency; wherein the adjusting mitigates a drop in voltage of a power supply to the integrated circuit associated with a transition of the scan clock from the first frequency to the second frequency, by reducing a change in current draw within a predetermined time period.

Some embodiments provide a method that includes receiving at least one of a global scan shift enable signal (SSE_Global) or one or more clock signals by a global scan circuit, converting the SSE_Global to a local scan shift enable signal (SSE_Local) by a global scan to local scan conversion circuit, and controlling at least one local scan operation by at least one local scan circuit, in response to SSE_Local.

The embodiments described herein may be used in any type of integrated circuit that uses scan testing techniques. One example is a general purpose microprocessor. A general purpose microprocessor typically performs basic arithmetic operations, moves data from one memory location to another, and makes decisions based on the quantity of certain values contained in registers or memory. To perform these activities, a microprocessor typically incorporates a number of execution units, such as a floating point unit or an integer execution unit, and control units. The control and execution units may be designed, for example, using scannable sequential elements configured into one or more scan chains. During testing of the device, test patterns can be generated and shifted into the control and execution units. A clock control unit coupled to the scannable sequential elements and to a scan-test register can provide the control and clocking necessary to capture the test results. Once captured, the test results may be shifted out by conventional means.

BRIEF DESCRIPTION OF THE FIGURES

The disclosed subject matter will hereafter be described with reference to the accompanying drawings, wherein like reference numerals denote like elements, and:

FIG. 7A provides a stylized representation of a silicon die/chip that includes one or more circuits as shown in FIG. 1-2 or 5-6, in accordance with some embodiments.

FIG. 7B provides a stylized representation of a silicon wafer which includes one or more dies/chips that may be produced in a fabrication facility, in accordance with some embodiments.

Figure 1:
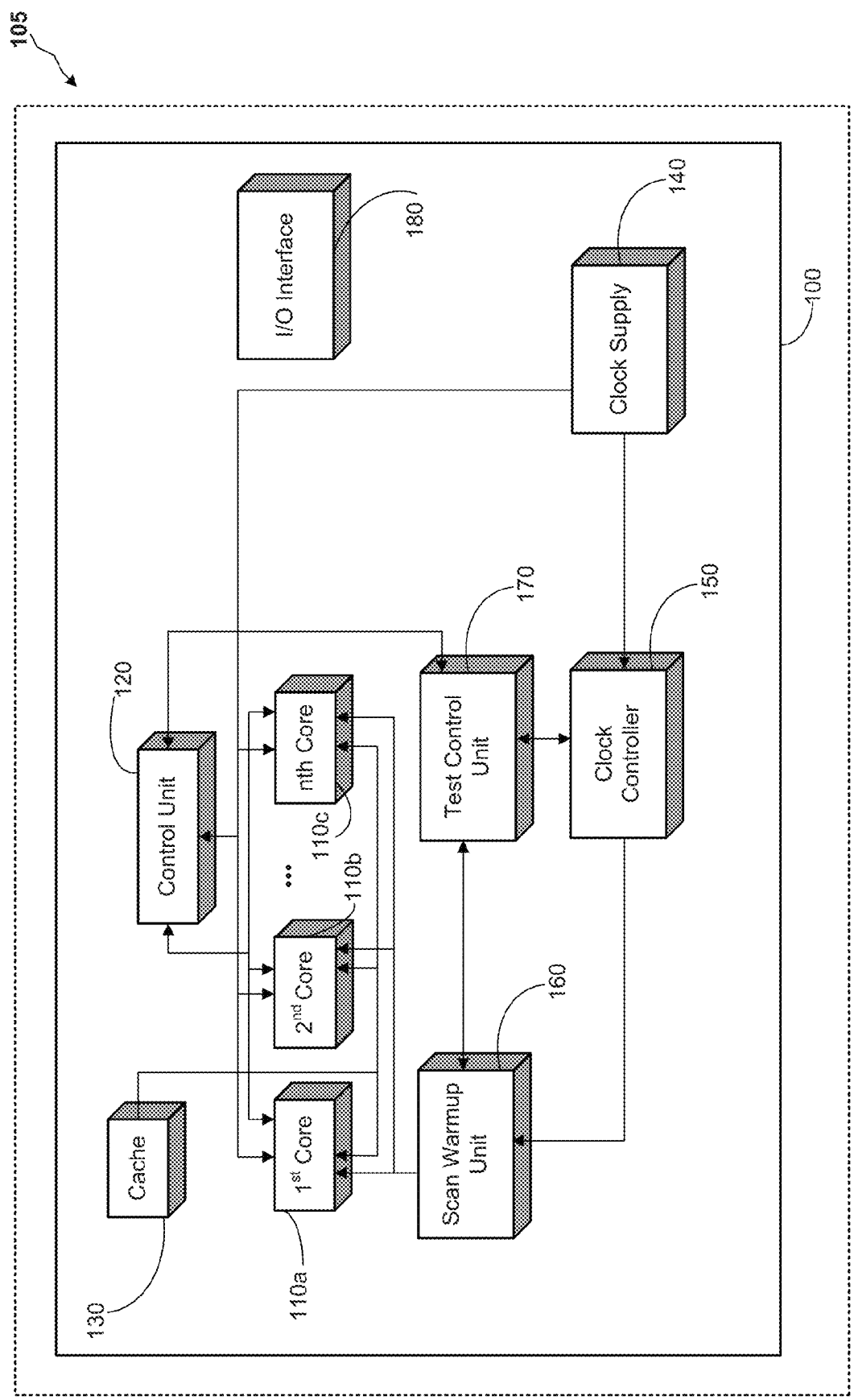
FIG. 1 is a simplified, stylized block diagram of an example microcircuit design in accordance with some embodiments.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

Embodiments provide for reducing the possibility of an excessive current draw in a relatively short period of time due to a test scan signal, such as a test consisting of cycles of shift and capture events. Embodiments provide for reducing the effect of a di/dt event in light of an instant excessive draw of current based upon a global scan signal. Upon assertion and deassertion of a global scan signal, between clock cycles, chip capacitance may discharge sufficiently such that upon start-up, an excessive demand for current may take place. In this case, the voltage of the power supply may drop, causing potential errors in various elements of the processor. Embodiments provide for reducing the drop in voltage in light of the di/dt event. Embodiments provide for ramping up a clock signal prior to the clock signal being placed into its normal frequency operation. In some embodiments, upon deassertion of the global scan signal, the shifting of the scanned data may be delayed, wherein the global scan signal may be converted to various local scan signals and the shifting may be delayed to prevent an instant excessive demand of current.

Turning now to FIG. 1, a block diagram, a stylized representation of a processor unit or CPU 100, in accordance with some embodiments, is illustrated. The processing unit 100 may be part of a computer system 105, wherein the computer system may exist in a variety of forms, such as a telephone, a tablet computer, a desktop computer, a laptop computer, a server, a smart television, among other consumer electronic devices. The processor unit 100 may comprise various cores 110 (e.g., first core 110a, second core 110b, through $n^{th}$ core 110c (collectively "cores 110")). The cores 110 may be compute units that are each capable of performing various computations and executions of instructions. The processing unit 100 may also comprise a control unit 120 to control various operations of various components of the processing unit 100. The processor unit 100 may also comprise a cache unit 130 that provides for memory resources for the first through Nth cores 110a-c. The processor unit 100 may also comprise a clock supply unit 140 that provides one or more clocks utilized by the processor unit 100. Further, the processor unit 100 may comprise a clock controller 150 for controlling the clocks to various portions of the processor unit 100. The processor unit 100 may also comprise a test control unit 170 for performing various tests and scan functions of the processor unit 100.

In some embodiments, the processor unit 100 also comprises a scan warmup unit 160 to control the clock operation and scanning and testing functions of the processor unit. The scan warmup unit 160 is capable of ramping up one remote clock, to mitigate a drop in voltage of a power supply to the processor unit 100 by reducing a change in current draw within a predetermined time period, such as a short time period as discussed above. The processor unit 100 also comprises an I/O interface 180. The processor unit 100 also comprises an I/O interface 180 for providing communications with various components external to the processor unit 100.

In various embodiments, one or more of the units described above may be instantiated by another unit. For example, the scan warmup unit 160 may be instantiated by clock supply unit 140 or clock controller 150.

Figure 2:
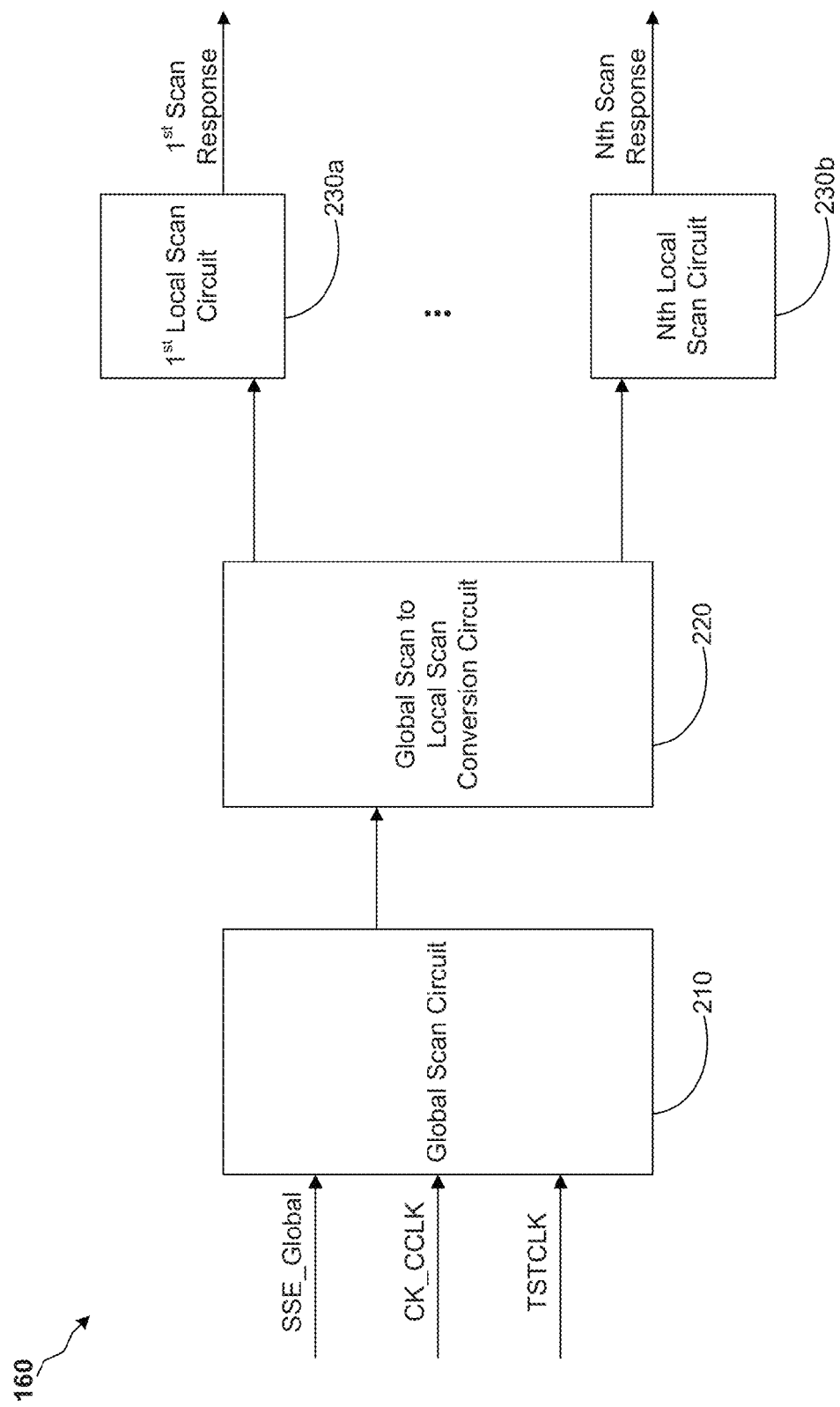
FIG. 2 is a simplified, stylized block diagram of a scan warmup unit depicted in FIG. 1, in accordance with some embodiments.

Turning now to FIG. 2, a stylized block diagram depiction of the scan warmup unit 160, in accordance with some embodiments is illustrated. The scan warmup unit 160 may comprise a global scan circuit 210 that provides various control and scanned data signals for testing various elements of the processor unit 100. In its operations, the global scan circuit 210 may receive and act upon one or more signals, such as a global scan shift enable signal (SSE_Global) and/or various clock signals (e.g., CK_CCLK or TSTCLK). The scan warmup unit 160 may also comprise a "global scan to local scan conversion circuit" 220 that is capable of converting global scan signals to local scan signals for reducing the di/dt effect. Specifically, the use of local scan signals may allow more control of timing of an SSE signal applied to a local logic area. This control of timing may allow reduction of the time between completion of a test scan shift and start of a test scan capture. By reducing this time, an IR drop generated during a shift may be used to mitigate a voltage droop commonly occurring during a capture. Moreover, the scan warmup unit 160 also comprises a first local scan circuit through an $n^{th}$ local scan circuit 230a, 230b, for providing scan control and operation of various portions of the processor unit 100.

Figure 5:
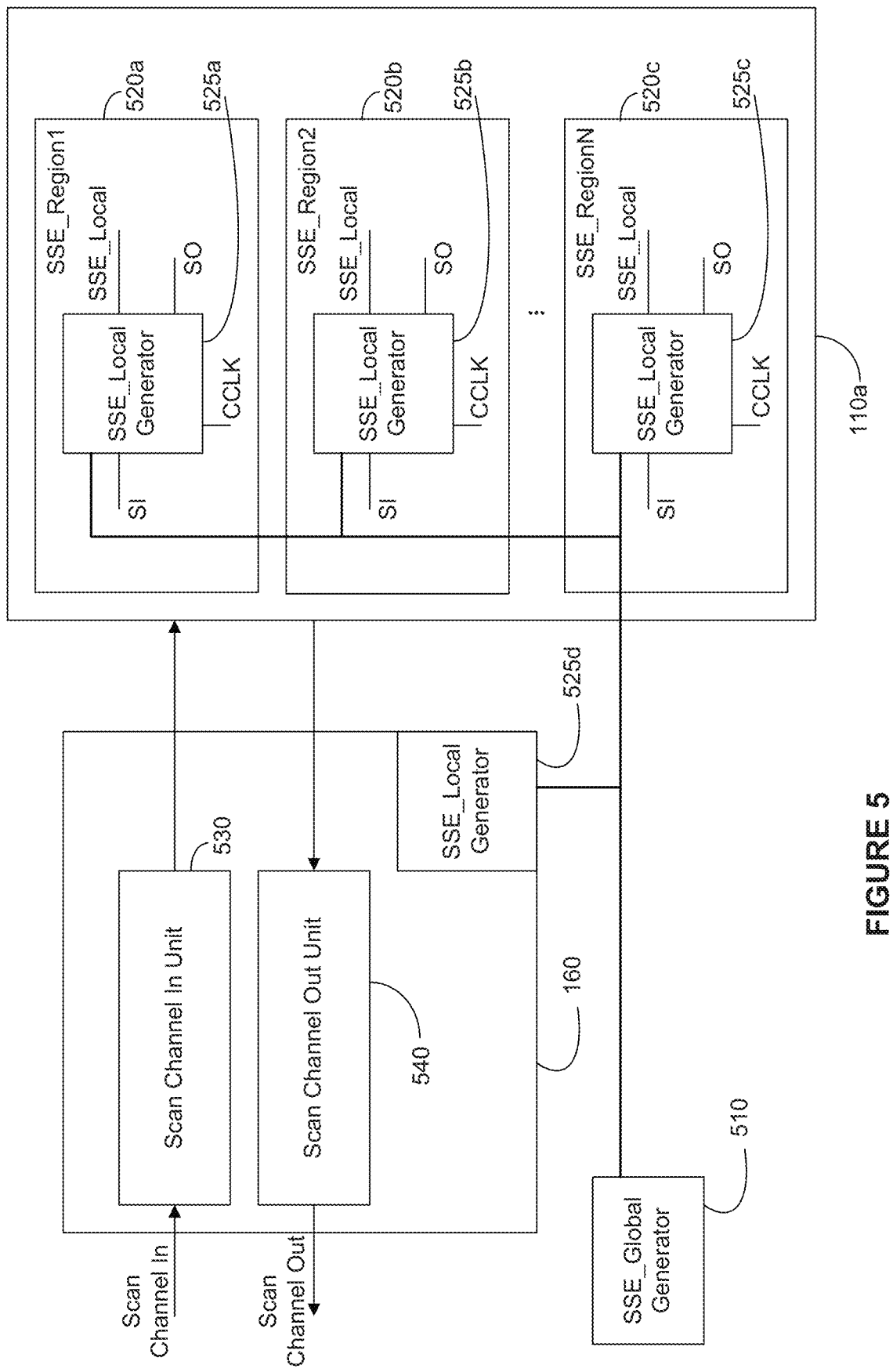
FIG. 5 is a simplified, stylized schematic diagram of a scan warmup unit and a core depicted in FIG. 1, in accordance with some embodiments.

FIG. 5 presents a stylized block diagram depiction of the scan warm up unit 160, a core 110a, and related components of the processor unit 100. SSE_Global generator 510 generates the SSE_Global, which is supplied to both the scan warmup unit 160 and the core 110a when under test. The core 110a comprises one or more SSE regions, such as a first SSE_Region 520a, a second SSE_Region 520b, through an $n^{th}$ SSE_Region 520c. The number of SSE Regions 520 may be selected based on the physical placement of components of the processor unit 100, timing dependencies, and the number of localized flop loads. Each SSE region comprises an SSE_Local generator 525a, 525b, 525c. The scan warmup unit 160 may also comprise an SSE_Local generator 525d.

In addition, the scan warmup unit 160 may comprise a scan channel in unit 530. The scan channel in unit 530 may receive and act on a scan channel in signal, such as by shifting data to one or more logical elements located within the core 110a. Further, scan warmup unit 160 may comprise a scan channel out unit 540. The scan channel out unit 540 may receive and act on data captured by one or more logical elements located within the core 110a, such as by outputting a scan channel out signal. The operations of the scan channel in unit 530 and/or the scan channel out unit 540 may be controlled at various times by timing signals generated by SSE_Global generator 510 or SSE_Local generator 525d.

As should be apparent to those skilled in the art, for convenience, FIG. 5 only depicts core 110a. Alternatively or in addition, one or more other cores, such as core 110b and/or core 110c, may comprise one or more SSE regions and SSE_Local generators.

Figure 6:
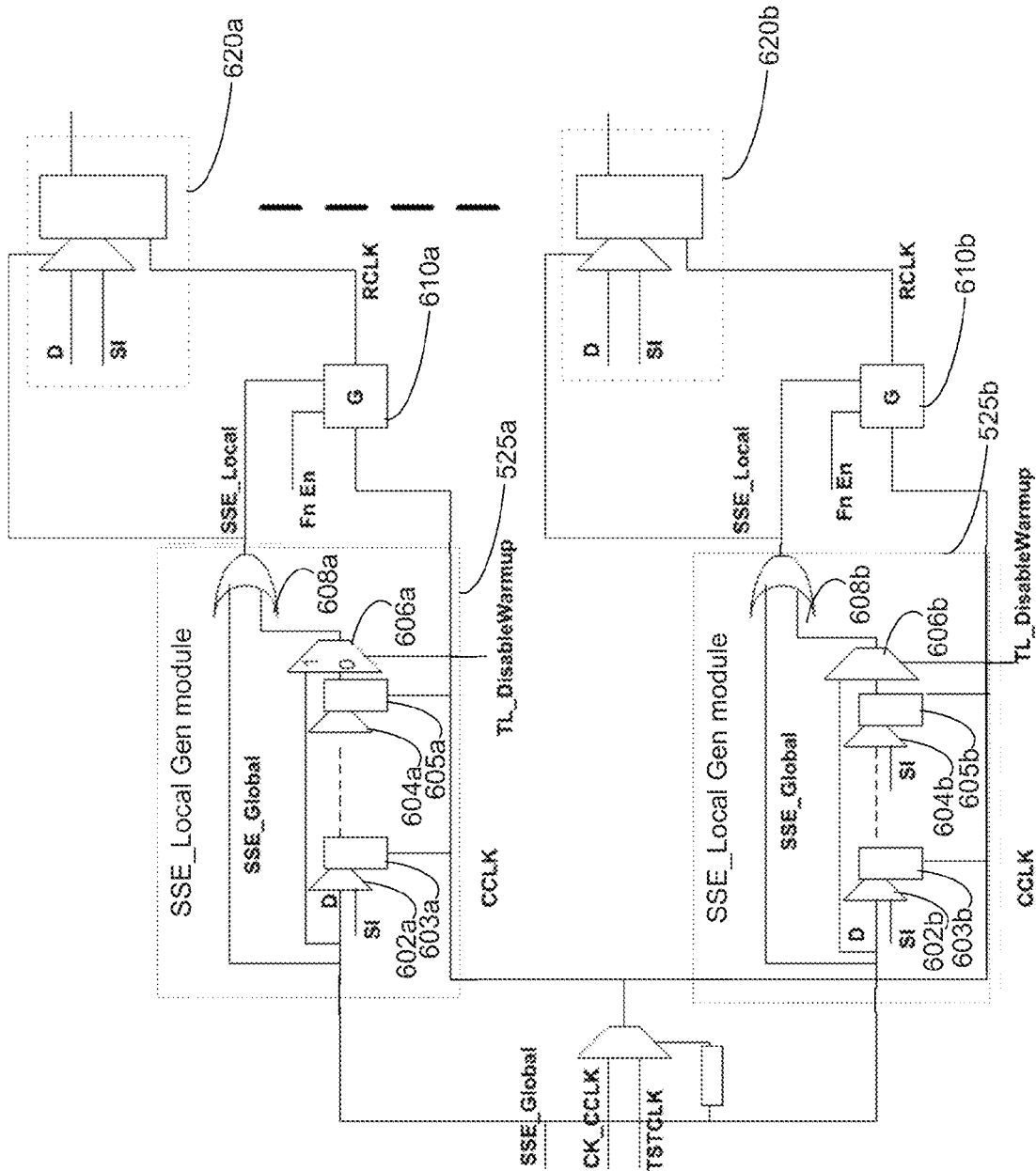
FIG. 6 is a simplified, stylized schematic diagram of an SSE_local (shift scan enable_local) generator depicted in FIG. 5, in accordance with some embodiments.

Turning to FIG. 6, a simplified schematic diagram of SSE_Local generators 525a, 525b, and related circuitry, is provided. SSE_Local generator 525a will be discussed in detail, with the understanding that the discussion will be similarly applicable to SSE_Local generator 525b. CK_CCLK and TSTCLK signals are muxed to provide a CCLK signal. CCLK and SSE_Global are provided to the SSE_Local generator 525a. The SSE_Local generator 525a comprises a number of elements 602a-608a, which generate an SSE_Local signal following the depicted logic. Specifically, if CCLK has the frequency of TSTCLK, SSE_Global is asserted, and scan warmup is disabled (TL_DisableWarmup=1), (i.e., the test is in the shift phase of the timing diagram shown in FIG.

4), then SSE_Local generator 525a will pass signals to logic elements 610a and 620a such that shift of data into logic element 620a is timed according to the TSTCLK frequency (RCLK=TSTCLK). If CCLK has the frequency CK_CCLK, scan warmup is enabled, and an SSE_Global signal is deasserted, then SSE_Local generator 525a will pass signals to logic elements 610a and 620a such that shift of data into logic element 620a is timed with RCLK having a ramped frequency increasing from TSTCLK to CK_CCLK. Thereafter, if scan warmup is disabled, then SSE_Local generator 525a will pass signals to logic elements 610a and 620a such that capture of data from logic element 620a is timed according to the CK_CCLK frequency. The output of the logic element 620a may contain test data that may be used to evaluate the operation of the processing unit 100. In this manner, the global SSE signal is transformed into one or more local SSE signals, which provides for a reduction of the possibility of a voltage drop due to the di/dt effect in the processing unit 100.

By way of example, an integrated circuit device may comprise a warmup pulses generation logic, which may be within a clock generation block, and at least two associated registers, one of which may store a clock ramp-up waveform during a warmup period, and the other of which may store a number of warmup pulses. In this example, an SSE_Local generator may comprise a down-counter initialized to the stored number of warmup pulses, and the down-counter may keep SSE_Local asserted until the down-counter reaches zero.

Figures 3, 4:
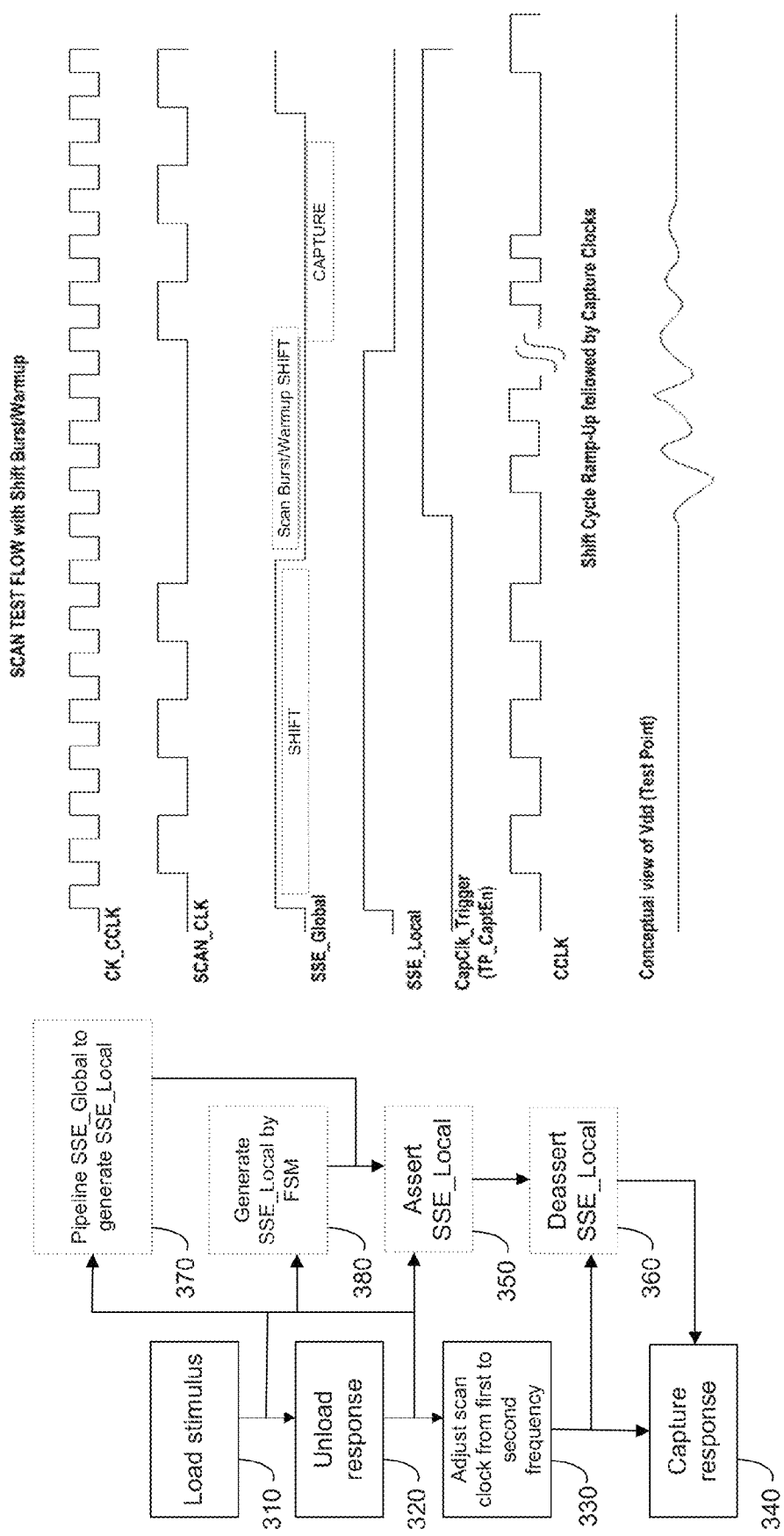
FIG. 3 is a flowchart of a method for performing a scan test of an integrated circuit, in accordance with some embodiments.
FIG. 4 is an example timing diagram including signals used when performing a scan test of an integrated circuit, in accordance with some embodiments.

FIG. 4 presents an example timing diagram including signals used when performing a scan test of an integrated circuit, in accordance with some embodiments. FIG. 4 illustrates an example system clock signal, CK_CCLK, and a clock for performing the scan operation, SCAN_CLK. Of particular note, at least one of SSE_Global and SSE_Local is active during data shift, and both are inactive during data capture. The period in which SSE_Local is active and SSE_Global is inactive may be referred to herein as the "scan burst/warmup" period. By operation of the scan warmup unit 160 and the SSE_Local generators 525a-d, CCLK can be ramped up from SCAN_CLK (the frequency for timing shift of data into logic elements under test) to CK_CCLK (the frequency for timing capture of data from logic elements under test), thereby reducing discharge by chip capacitance, reducing power draw, and thus reducing the di/dt event. By ramping under the assertion of SSE_Local, the time between completion of a test scan shift and start of a test scan capture may be reduced. By reducing this time, an IR drop generated during a shift may be used to mitigate a voltage droop as may occur during a capture.

FIG. 3 presents a flowchart depicting a method 300 for performing a scan test of an integrated circuit according to some embodiments. In FIG. 3, the method 300 may comprise: loading at 310 a scan test stimulus to a first set of logic elements of an integrated circuit device at a scan clock first frequency equal to a test clock frequency; unloading at 320 a scan test response from the first set of logic elements at the scan clock first frequency; and adjusting at 330 the scan clock from the first frequency to a second frequency by a scan warmup unit, wherein the scan clock second frequency is equal to a system clock frequency. In some embodiments, the test clock frequency is less than the system clock frequency, and the adjusting at 330 comprises ramping up the scan clock from the first frequency to the second frequency. In some embodiments, the adjusting at 330 may mitigate a drop in voltage of a power supply to the integrated circuit associated with a transition of the scan clock from the first frequency to the second frequency, by reducing a change in current draw within a predetermined time period. In some further embodiments, ramping up the scan clock may be performed subsequent to deasserting a global scan shift enable signal (SSE_Global) and prior to deasserting a local scan shift enable signal (SSE_Local). The method 300 may further comprise capturing at 340 the scan test response by a shift logic at the scan clock second frequency.

In some embodiments, the method 300 may further comprise asserting at 350 a local scan shift enable signal (SSE_Local) for at least one region of the integrated circuit device prior to completion of the loading, the unloading, or both, wherein the at least one region comprises at least the first set of logic elements; and deasserting at 360 the SSE_Local for the at least one region subsequent the adjusting and prior to the capturing.

The SSE_Local may be generated using any appropriate technique. In some embodiments, the method 300 may further comprise pipelining at 370 a global scan shift enable signal (SSE_Global) to generate the SSE_Local Alternatively or in addition, in some embodiments, the method 300 may further comprise generating the SSE_Local by use of a finite state machine. Such a finite state machine may implement a counter, such as a down counter.

Alternatively or in addition, in another particular embodiment (not shown), the method further comprises ramping up a clock subsequent to deasserting at 340 the first scan shift enable signal and subsequent to asserting at 360 the second scan shift enable signal.

Turning now to FIG. 7A, in some embodiments, the processing unit 100 may reside on a silicon die/chip 710. The silicon die/chip 710 may be housed on a motherboard or other structure of a computer system. In one or more embodiments (not shown), there may be more than one processing unit 100 on each silicon die/chip 710. Various embodiments of the processing unit 100 may be used in a wide variety of electronic devices.

Turning now to FIG. 7B in accordance with some embodiments, and as described above, the processing unit 100 may be included on the silicon chip/die 710. The silicon chip/die 710 may contain one or more different configurations of the processing unit 100. The silicon chip/die 710 may be produced on a silicon wafer 720 in a fabrication facility (or "fab") 730. That is, the silicon wafers 720 and the silicon die/chip 710 may be referred to as the output, or product of, the fab 730. The silicon chip/die 710 may be used in electronic devices.

The circuits described herein may be formed on a semiconductor material by any known means in the art. Forming can be done, for example, by growing or deposition, or by any other means known in the art. Different kinds of hardware descriptive languages (HDL) may be used in the process of designing and manufacturing the microcircuit devices. Examples include VHDL and Verilog/Verilog-XL. In some embodiments, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in some embodiments, may be used to configure a manufacturing facility (e.g., through the use of mask works) to create devices capable of embodying various aspects of the instant disclosure. As understood by one or ordinary skill in the art, it may be programmed into a computer, processor, or controller, which may then control, in whole or part, the operation of a semiconductor manufacturing facility (or fab) to create semiconductor products and devices. In other words, some embodiments relate to a non-transitory computer-readable medium storing instructions executable by at least one processor to fabricate an integrated circuit. These tools may be used to construct the embodiments of the disclosure described herein.

Any method described herein may be implemented by a non-transitory computer-readable medium storing instructions that, when executed by a computer system, implement the method.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   loading a scan test stimulus to a first set of logic elements of an integrated circuit device at a scan clock first frequency equal to a test clock frequency;
   unloading a scan test response from the first set of logic elements at the scan clock first frequency;
   adjusting the scan clock from the scan clock first frequency to a scan clock second frequency by ramping up the scan clock from the first frequency to the second frequency by a scan warmup unit, wherein the scan clock second frequency is equal to a system clock frequency, and wherein the test clock frequency is less than the system clock frequency; and
   capturing the scan test response by a shift logic at the scan clock second frequency; and
   wherein the adjusting mitigates a drop in voltage of a power supply to the integrated circuit associated with a transition of the scan clock from the first frequency to the second frequency, by reducing a change in current draw within a predetermined time period.

2. The method of claim 1, further comprising:
   asserting a local scan shift enable signal (SSE_Local) for at least one region of the integrated circuit device prior to completion of the loading, the unloading, or both, wherein the at least one region comprises at least the first set of logic elements; and
   deasserting the SSE_Local for the at least one region subsequent the adjusting and prior to the capturing.

3. The method of claim 2, further comprising pipelining a global scan shift enable signal (SSE_Global) to generate the SSE_Local.

4. The method of claim 2, further comprising generating the SSE_Local by use of a finite state machine.

5. The method of claim 2, wherein the test clock frequency is less than the system clock frequency, and the adjusting comprises ramping up the scan clock from the first frequency to the second frequency subsequent to deasserting a global scan shift enable signal (SSE_Global) and prior to deasserting the SSE_Local.

6. An integrated circuit device, comprising:
   a first set of logic elements;
   a shift logic to load a stimulus to the first set of logic elements at a scan clock first frequency equal to a test clock frequency, unload a scan test response from the first set of logic elements at the scan clock first frequency, and capture a scan test response by a shift logic at a scan clock second frequency; and
   a scan warmup unit to adjust the scan clock from the first frequency to the second frequency by ramping up the scan clock from the first frequency to the second frequency, wherein the scan clock second frequency is equal to a system clock frequency and wherein the test clock frequency is less than the system clock frequency, and to mitigate a drop in voltage of a power supply to the integrated circuit associated with a transition of the scan clock from the first frequency to the second frequency, by reducing a change in current draw within a predetermined time period.

7. The integrated circuit device of claim 6, further comprising:
   at least one local scan shift enable signal generator to assert a local scan shift enable signal (SSE_Local) for at least one region of the integrated circuit device prior to completion of the loading, the unloading, or both, wherein the at least one region comprises at least the first set of logic elements, and to deassert the SSE_Local for the at least one region subsequent the adjusting and prior to the capturing.

8. The integrated circuit device of claim 7, further comprising:
   a global scan shift enable signal generator to generate a global scan shift enable signal (SSE_Global); and
   wherein the at least one local scan shift enable signal generator is to generate the SSE_Local by pipelining the SSE_Global.

9. The integrated circuit device of claim 7, wherein the at least one local scan shift enable signal generator is to generate the SSE_Local by use of a finite state machine.

10. The integrated circuit device of claim 6, wherein the scan warmup unit is to ramp up the scan clock from the first frequency to the second frequency subsequent to deasserting an SSE_Global and prior to deasserting an SSE_Local.

11. A non-transitory computer-readable medium storing instructions that, when executed by a computer system in a manufacturing facility, adapts the manufacturing facility to create an integrated circuit, the integrated circuit comprising:
   a first set of logic elements;
   a shift logic to load a stimulus to the first set of logic elements at a scan clock first frequency equal to a test clock frequency, unload a scan test response from the first set of logic elements at the scan clock first frequency, and capture a scan test response by a shift logic at a scan clock second frequency; and
   a scan warmup unit to adjust the scan clock from the first frequency to the second frequency by ramping up the scan clock from the first frequency to the second frequency, wherein the scan clock second frequency is equal to a system clock frequency and wherein the test dock frequency is less than the system dock frequency, and to mitigate a drop in voltage of a power supply to the integrated circuit associated with a transition of the scan clock from the first frequency to the second frequency, by reducing a change in current draw within a predetermined time period.

12. The non-transitory computer-readable medium of claim 11, wherein the integrated circuit further comprises at least one local scan shift enable signal generator to assert a local scan shift enable signal (SSE_Local) for at least one region of the integrated circuit prior to completion of the loading, the unloading, or both, wherein the at least one region comprises at least the first set of logic elements, and to deassert the SSE_Local for the at least one region subsequent the adjusting and prior to the capturing.

13. The non-transitory computer-readable medium of claim 12, wherein the integrated circuit further comprises a global scan shift enable signal generator to generate a global scan shift enable signal (SSE_Global); and wherein the at least one local scan shift enable signal generator is configured to generate the SSE_Local by pipelining the SSE_Global.

14. The non-transitory computer-readable medium of claim 12, wherein the at least one local scan shift enable signal generator is to generate the SSE_Local by use of a finite state machine.

15. The non-transitory computer-readable medium of claim 11, wherein the scan warmup unit is to ramp up the scan clock from the first frequency to the second frequency subsequent to deasserting an SSE_Global and prior to deasserting an SSE_Local.

* * * * *